United States Patent
Kuroki

(10) Patent No.: US 7,210,007 B2
(45) Date of Patent: Apr. 24, 2007

(54) METHOD OF VERIFYING A SYSTEM IN WHICH A PLURALITY OF MASTER DEVICES SHARE A STORAGE DEVICE

(75) Inventor: Daisuke Kuroki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/331,145

(22) Filed: Jan. 13, 2006

(65) Prior Publication Data

US 2006/0117151 A1 Jun. 1, 2006

Related U.S. Application Data

(62) Division of application No. 10/309,091, filed on Dec. 4, 2002, now Pat. No. 7,028,146.

(30) Foreign Application Priority Data

Dec. 19, 2001 (JP) .............................. 2001-386132

(51) Int. Cl.
*G06F 13/00* (2006.01)
(52) U.S. Cl. ..................... 711/147; 711/146; 711/154
(58) Field of Classification Search ................ 711/146, 711/147, 154
See application file for complete search history.

(56) References Cited

U.S. PATENT DOCUMENTS 5,809,294 A     9/1998    Ando ......................... 712/233
6,260,135 B1 *   7/2001    Yoshida ..................... 712/214

* cited by examiner

*Primary Examiner*—Reba I. Elmore
(74) *Attorney, Agent, or Firm*—Fitzpatrick, Cella, Harper & Scinto

(57) ABSTRACT

In logical verification of a system in which a plurality of master devices share a storage region, a scoreboard common to all master devices is provided. When starting verification, an initial value of data stored in each address of each storage device is set in correspondence with the address in the scoreboard. When each master device performs write access to an address of a storage device, data corresponding to the address in the scoreboard is updated with written data. When each master device performs read access to an address of a storage device, data read out of the storage device is compared with data corresponding to the address in the scoreboard. Thus, the storage devices and the controller are verified.

5 Claims, 4 Drawing Sheets

METHOD OF VERIFYING A SYSTEM IN WHICH A PLURALITY OF MASTER DEVICES SHARE A STORAGE DEVICE

This application is a division of application Ser. No. 10/309,091, filed Dec. 4, 2002 now U.S. Pat. No. 7,028,146.

BACKGROUND OF THE INVENTION

1. Field of the Invention

The present invention relates to a method of verifying a storage device and a memory controller in a system (verification circuit) in which a plurality of master devices access a common storage region.

2. Description of the Related Art

FIG. 4 is a block diagram illustrating the configuration of a system in which a conventional verification method is performed. In FIG. 4, a CPU (central processing unit) 1 controls respective units of the system, and also operates as one of master devices. Master devices 2 and 3 are connected to a CPU bus 10. A memory 4 is a storage device connected to the CPU bus 10 via a memory controller 9. A resister 5 is a storage device within a module 1 connected to the CPU bus 10. A register 6 is a storage device also connected to the CPU bus 10.

In verification of the storage devices and the memory controller 9, there sometimes occurs as a verification item that a master device writes data in the memory 4, and thereafter the CPU 1 reads the data stored in the memory 4. In such a case, in order to check that the data written by the master device equals the data read by the CPU 1, the written data is explicitly stored within a test program, and the test program compares the stored data with the read data. Similarly, in verification of the other storage device 5 or 6, data written from each master device (data that must be stored in the storage device) is managed and stored in an individual test program.

The above-described case may happen in all combinations of a master device and a storage device (the same master device may write data and thereafter read the data, or data may be consecutively written in or read from the same storage device). Even when executing only one test program, management of data is considerably complicated, and a plurality of test programs must be simultaneously executed depending on an object to be verified. In such a case, interference among the test programs must be taken into consideration, resulting in more complicated management.

Accordingly, it is inefficient to individually manage data stored in a storage device in each test program, and each test program must independently manage data stored in the storage device, resulting in an increase in the amount of description in the test program, and greater inefficiency.

SUMMARY OF THE INVENTION

It is an object of the present invention to provide a verification method capable of performing unitary management of data stored in storage devices, and efficient verification, in a system in which a plurality of master devices share a storage region.

According to one aspect, the present invention which achieves the above-described object relates to a method of verifying a system in which a plurality of master devices share a storage region. The method includes the steps of setting, when staring verification, an initial value of data stored in each address of each storage device in correspondence with the address in a scoreboard common to all master devices, updating, when each master device performs write access to an address of a storage device, data corresponding to the address in the scoreboard with written data, and comparing, when each master device performs read access to an address of a storage device, data read out of the storage device with data corresponding to the address in the scoreboard.

Other objectives and advantages besides those discussed above shall be apparent to those skilled in the art from the description of the preferred embodiments of the invention which follows. In the description, reference is made to accompanying drawings, which form a part thereof, and which illustrate an example of the invention. Such an example, however, is not exhaustive of the various embodiments of the invention, and therefore reference is made to the claims which follow the description for determining the scope of the invention.

DESCRIPTION OF THE PREFERRED EMBODIMENTS

Preferred embodiments of the present invention will now be described in detail with reference to the drawings.

First, in first and second embodiments of the present invention, two cases having different locations of scoreboards, and different updating methods will be described. In a third embodiment of the present invention, a case in which a controller for storage devices has an out-of-order function will be described.

First Embodiment

Figure 1:
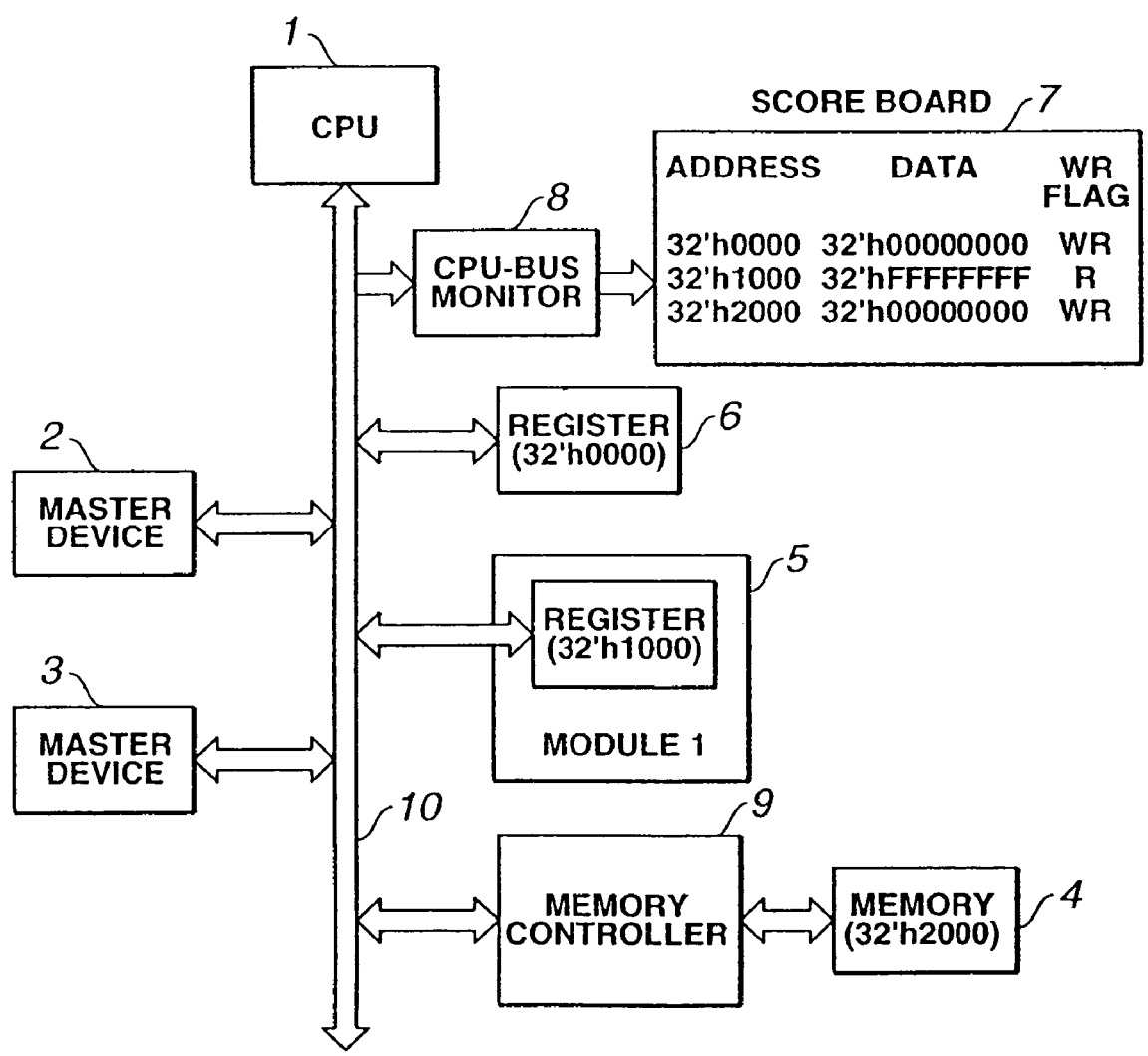
FIG. 1 is a block diagram illustrating the configuration of a system that performs a verification method according to a first embodiment of the present invention.

The first embodiment relates to a case in which a scoreboard is managed by a CPU-bus monitor. FIG. 1 is a block diagram illustrating the configuration of a system in which a verification method of the first embodiment is performed.

Figure 4:
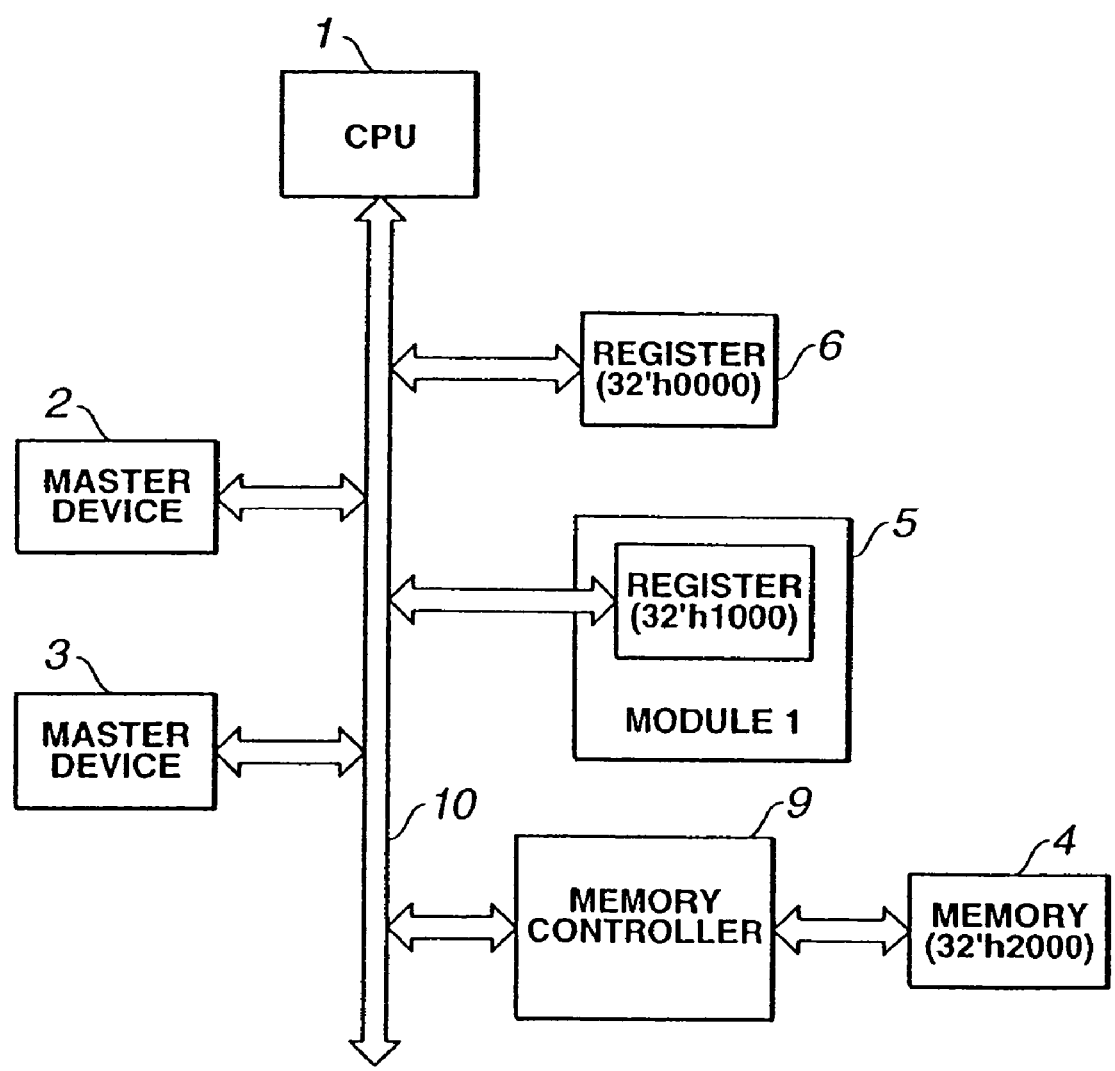
FIG. 4 is a block diagram illustrating the configuration of a system that performs a conventional verification method.

In FIG. 1, a scoreboard 7 stores data of storage devices (registers 5 and 6, and a memory 4). A CPU-bus monitor 8 monitors a CPU bus 10, and manages the scoreboard 7. Other units are the same as in FIG. 4.

The scoreboard 7 includes items relating to addresses corresponding to the registers 5 and 6, and the memory 4, items relating to data corresponding to the respective addresses, and items relating to WR flags indicating whether each of the storage devices performs only write, only read, or both write and read. A flag indicating an access method, such as a method capable of performing word access or byte access, may also be provided.

The CPU-bus monitor 8 monitors transaction on the CPU bus 10, and updates the scoreboard 7 in the case of a write command, and compares data read from a storage device with data in the scoreboard 7 in the case of a read command.

A verification procedure will now be described. First, when the CPU-bus monitor 8 recognizes reset of a verification circuit, the scoreboard 7 is reset, to set data in the scoreboard 7 to initial values of the respective storage devices.

Then, test is started. When a master device provides a storage device with a write command, the CPU-bus monitor 8 determines that the command is a write command from transaction of the CPU bus 10, and updates data corresponding to an address of the storage device where write is performed, in the scoreboard 7. When a master device provides a read command, the CPU-bus monitor 8 determines that the command is a read command from transaction of the CPU bus 10, and reads data corresponding to an address of the storage device where data is read, from the scoreboard 7, and compares data read from an actual storage device of the verification circuit with data read from the scoreboard 7.

More specifically, when a master device provides the memory 4 (having an address of 32'h2000) with a command to write data 32'h00000000, the CPU-bus monitor 8 updates data to 32'h00000000, because the WR flag indicates WR (capable of performing both write and read) in address 32'h2000 in the scoreboard 7. When the CPU 1 provides the memory 4 (having the address 32'h2000) with a read command, the CPU-bus monitor 8 confirms that the WR flag indicates WR in address 32'h2000 in the scoreboard 7, uses that data as an expected value, and compares the data with data actually read from the memory 4. When a write command is provided for the register 5 (having an address of 32'h1000), the CPU-bus monitor 8 does not update data, because the WR flag for address 32'h1000 in the scoreboard 7 indicates R (only read).

Second Embodiment

Figure 2:
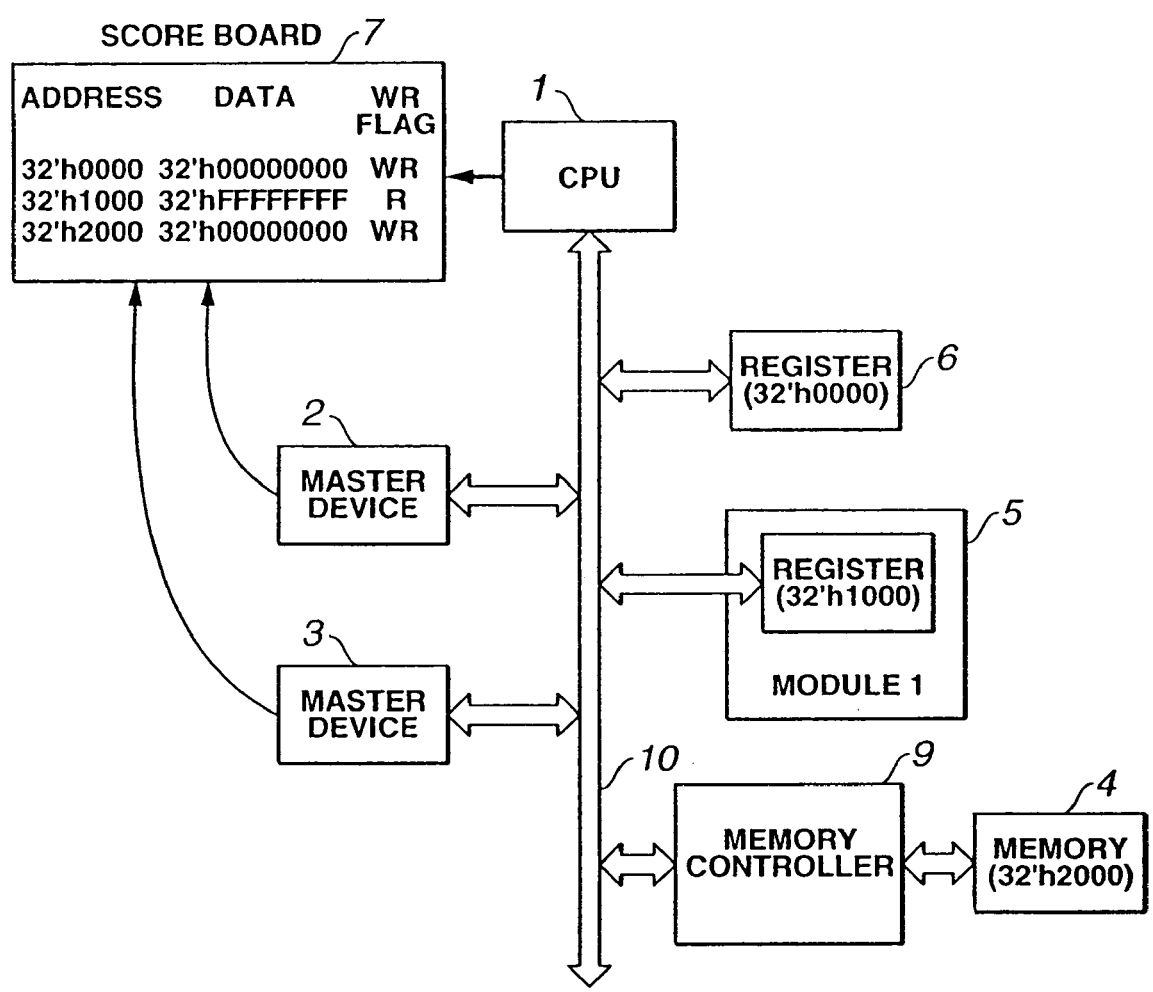
FIG. 2 is a block diagram illustrating the configuration of a system that performs a verification method according to a second embodiment of the present invention.

In a second embodiment of the present invention, each master device is caused to manage the scoreboard 7. FIG. 2 is a block diagram illustrating the configuration of a system in which a verification method according to the second embodiment is performed.

The configuration shown in FIG. 2 differs from the configuration shown in FIG. 1 in that the bus monitor 8 is not provided, and the scoreboard 7 performs read/write with respect to a CPU 1, and master devices 2 and 3. For that purpose, a function of updating the scoreboard 7 when each of the master devices (the CPU 1, and the master devices 2 and 3) performs a writing operation, and comparing a command read from a storage device with data in the scoreboard 7 when each of the master devices performs a reading operation is added in each of the master devices.

A verification procedure will now be described. First, when each of the master devices recognizes reset of a verification circuit, the scoreboard 7 is reset, to set data in the scoreboard 7 to initial values of the respective storage devices.

Then, test is started. When a master device provides a storage device with a write command, the master device updates data corresponding to an address of the storage device where write is performed, in the scoreboard 7. When a master device provides a read command, the master device reads data corresponding to an address of the storage device where data is read, from the scoreboard 7, and compares data read from an actual storage device of the verification circuit with data read from the scoreboard 7.

More specifically, when a master device provides a memory 4 (having an address of 32'h2000) with a command to write data 32'h00000000, the master device updates data to 32'h00000000, because the WR flag indicates WR (capable of performing both write and read) in address 32'h2000 in the scoreboard 7. When the CPU 1 provides the memory 4 (having an address of 32'h2000) with a read command, the CPU 1 confirms that the WR flag indicates WR in address 32'h2000 in the scoreboard 7, uses that data as an expected value, and compares the data with data actually read from the memory 4. When the CPU 1 provides the register 5 (having an address of 32'h1000) with a write command, the CPU 1 does not update data, because the WR flag in address 32'h1000 in the scoreboard 7 indicates R (only read).

Third Embodiment

Figure 3:
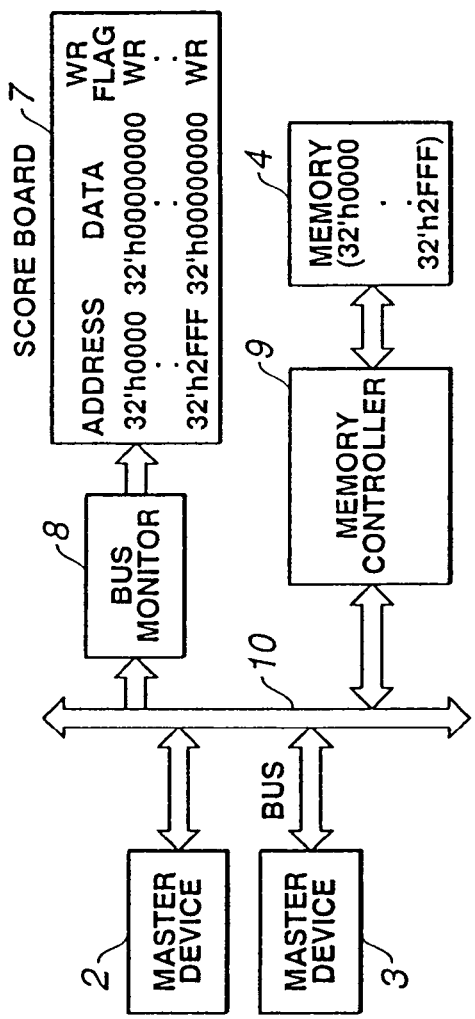
FIG. 3 is a block diagram illustrating the configuration of a system that performs a verification method according to a third embodiment of the present invention.

A third embodiment of the present invention is a case in which a controller for storage devices has an out-of-order function. FIG. 3 is a block diagram illustrating the configuration of a system in which a verification method according to the third embodiment is performed. A scoreboard is managed according to the method performed by the bus monitor in the first embodiment.

In FIG. 3, a memory controller 9 controls a memory 4, and operates as a slave device of a bus 10. The bus 10 has two master devices 2 and 3, and one slave device. A bus monitor 8 monitors transaction of the bus 10, and updates a scoreboard 7 in the case of a write command, and compares data in the scoreboard 7 with data on the bus 10 in the case of a read command. The memory controller 9 has an out-of-order function of receiving some sets of transaction (hereinafter termed "queuing") from the bus 10 in advance, and accessing the memory 4 by rearranging the sets of transaction so that performance is optimum and not contradictory. An object to be verified in the third embodiment is the memory controller 9. The bus monitor 8 monitors the bus 10, and updates the scoreboard 7 and compares expected values in the order of transaction performed by the master devices 2 and 3 for the bus 10.

FIG. 3 shows examples of two accesses, i.e., case 1 and case 2. In each of case 1 and case 2, the left side represents a table illustrating "transaction at bus". The table indicates the order of reception and storage of transaction (hereinafter termed "queuing") by the memory controller 9, each master device performing transaction, and information indicating write or read, and information relating to each address. The table of "access order of memory controller to memory" indicates the order of access to the memory 4 when the memory controller 9 performs an out-of-order operation, based on the "transaction order at bus", each master device, information indicating write or read, and information relating to each address.

In case 1, three commands subjected to queuing have different addresses, i.e., there is no correlation among three sets of transaction. Accordingly, no matter how the order is changed according to an out-of-order operation, no logical contradiction occurs. Hence, no error is produced in data comparison during a reading operation by the bus monitor 8.

In case 2, all of three commands subjected to queuing indicate the same address. That is, there is a correlation among the three sets of transaction. In a reading operation by the master device 3, it is expected to read data written by the master device 2. However, there is a bug in the memory controller 9, and when an out-of-order operation is performed as in the table indicating "the order of access the memory controller to the memory" in case 2, the scoreboard 7 is updated in the order of transaction by the bus monitor 8, and in comparison of an expected value in the scoreboard 7 with a value read by the master device 3, the expected value is data written by the master device 2. On the other hand, data flown on the bus 10 by being read from the memory 4 as the actual value is data already stored in the memory 4 before a writing operation by the master device 2, the two values do not coincide, thereby producing error. Thus, presence of a bug in the memory controller 9 can be easily found.

As described above, by using a scoreboard, an out-of-order function can be verified by the scoreboard and a bus monitor. Accordingly, the out-of-order function can be very efficiently and simply verified.

According to the above-described embodiments, data stored in storage devices are subjected to unitary management using a scoreboard. When a plurality of test programs are simultaneously executed for respective master devices and storage devices, a common scoreboard is also used. Accordingly, it is unnecessary to take into consideration of interference among the respective test programs. Furthermore, it is unnecessary to manage data of a storage device in each test program, and therefore it is possible to efficiently form a test program. Accordingly, it is possible to efficiently verify an LSI (large-scale integrated circuit). In addition, when a controller for storage devices has an out-of-order function of changing the order of transactions, it is also possible to efficiently perform verification.

The individual components designated by blocks in the drawings are all well known in the system verification method arts and their specific construction and operation are not critical to the operation or the best mode for carrying out the invention.

Although the present invention has been described in its preferred form with a certain degree of particularity, many apparently widely different embodiments of the invention can be made without departing from the spirit and the scope of thereof. It is to be understood that the invention is not limited to the specific embodiments thereof except as defined in the appended claims.

What is claimed is:

1. A method of verifying a system in which a plurality of master devices share a storage device, said method comprising the steps of:

setting an initial value of data stored in each address of the storage device in a scoreboard common to all master devices, wherein the initial value of data stored in each address of the storage device is set in the scoreboard in correspondence with the address, and wherein the initial value of data stored in each address of the storage device is set in the scoreboard when starting verification;

updating data stored in the scoreboard in correspondence with a first address of the storage device with data written to the first address of the storage device, wherein the data stored in the scoreboard in correspondence with the first address of the storage device is updated when any one of the master devices writes data in the first address of the storage device; and comparing data read out of a second address of the storage device with data stored in the scoreboard in correspondence with the second address of the storage device, wherein the data read out of the second address of the storage device is compared with the data stored in the scoreboard in correspondence with the second address of the storage device when any one of the master devices reads out data of the second address of the storage device.

2. A method according to claim 1, wherein the system includes a bus monitor for monitoring transaction on a bus, and wherein the bus monitor performs read/write and comparison in the scoreboard in response to the transaction.

3. A method according to claim 1, wherein the master device accessing the storage device performs read/write and comparison in the scoreboard.

4. A method according to claim 1, wherein in the system, a controller for controlling the storage devices has an out-of-order function of executing access requests from a plurality of master devices by changing an order of execution, and wherein the out-of-order function of the controller is verified based on a result of the comparison.

5. A system in which a plurality of master devices share a storage device, comprising:

a scoreboard common to the plurality of master devices;

setting means for setting an initial value of data stored in each address of the storage device in the scoreboard, wherein the initial value of data stored in each address of the storage device is set in the scoreboard in correspondence with the address, and wherein the initial value of data stored in each address of the storage device is set in the scoreboard when starting verification;

updating means for updating data stored in the scoreboard in correspondence with a first address of the storage device with data written to the first address of the storage device, wherein the data stored in the scoreboard in correspondence with the first address of the storage device is updated when any one of the master devices writes data in the first address of the storage device; and comparing means for comparing data read out of a second address of the storage device with data stored in the scoreboard in correspondence with the second address of the storage device, wherein the data read out of the second address of the storage device is compared with the data stored in the scoreboard in correspondence with the second address of the storage device when any one of the master devices reads out data of the second address of the storage device.

* * * * *